US012627117B2

(12) United States Patent
Aoki et al.

(10) Patent No.: US 12,627,117 B2
(45) Date of Patent: May 12, 2026

(54) SURFACE-EMITTING LASER WITH OPTIMIZED DBR STRUCTURE AND ENHANCED OPTICAL CONFINEMENT

(71) Applicant: SUMITOMO ELECTRIC INDUSTRIES, LTD., Osaka (JP)

(72) Inventors: Takeshi Aoki, Osaka (JP); Susumu Yoshimoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 1085 days.

(21) Appl. No.: 17/616,051

(22) PCT Filed: Mar. 31, 2020

(86) PCT No.: PCT/JP2020/014766
§ 371 (c)(1),
(2) Date: Dec. 2, 2021

(87) PCT Pub. No.: WO2020/261687
PCT Pub. Date: Dec. 30, 2020

(65) Prior Publication Data
US 2022/0320830 A1 Oct. 6, 2022

(30) Foreign Application Priority Data

Jun. 24, 2019 (JP) ................................. 2019-116709

(51) Int. Cl.
*H01S 5/183* (2006.01)
*H01S 5/343* (2006.01)

(52) U.S. Cl.
CPC ...... *H01S 5/18341* (2013.01); *H01S 5/18352* (2013.01); *H01S 5/18361* (2013.01);
(Continued)

(58) Field of Classification Search
CPC ............. H01S 5/18341; H01S 5/18352; H01S 5/18361; H01S 5/18313; H01S 5/18358; H01S 5/34313; H01S 5/34353
See application file for complete search history.

(56) References Cited

U.S. PATENT DOCUMENTS 7,215,693 B2 * 5/2007 Iwai .................... H01S 5/18313
                                                372/50.1
2005/0213629 A1 * 9/2005 Takahashi ............... H01S 5/187
                                                372/99

(Continued)

FOREIGN PATENT DOCUMENTS

JP      2016-004944 A    1/2016
JP      2019-040953 A    3/2019
WO      2013/176201 A1   11/2013

OTHER PUBLICATIONS

WO 2019/101877 (corresponds to US 2020/0287351).*

(Continued)

*Primary Examiner* — M. A. Golub-Miller
(74) *Attorney, Agent, or Firm* — Volpe Koenig

(57) ABSTRACT

A surface-emitting laser includes a substrate, a lower DBR layer, a cavity layer, and an upper DBR layer stacked in order. The lower DBR layer has a first DBR layer, a contact layer, and a second DBR layer. The first and second DBR layers each include alternating first and second semiconductor layers containing aluminum, with the second layers having higher aluminum composition. The second DBR layer includes 12 to 20 pairs of layers. The cavity layer includes spacer layers and a quantum well light-emitting layer, with specified aluminum compositions to optimize optical confinement. The contact layer has an aluminum composition of 0.2 or less. The second DBR layer uses n-type material; the upper DBR layer uses p-type material and an oxide confinement layer. The laser forms a mesa (Continued)

structure with sidewall angles between 70° and 80°. This structure enables improved optical confinement, efficient carrier injection, and enhanced laser performance.

9 Claims, 5 Drawing Sheets

(52) U.S. Cl.
CPC ....... *H01S 5/18313* (2013.01); *H01S 5/18358* (2013.01); *H01S 5/34313* (2013.01); *H01S 5/34353* (2013.01)

(56) References Cited

U.S. PATENT DOCUMENTS

2011/0293331 A1* 12/2011 Inao ..................... H01S 5/3022
                                                          372/46.013
2015/0063393 A1     3/2015 Iwata et al.
2019/0035954 A1*  1/2019 Fuyuki .................. H10F 77/146
2019/0044306 A1*  2/2019 Tanahashi ............. H01S 5/3072
2019/0067908 A1     2/2019 Onishi
2019/0148914 A1*  5/2019 Fujii ................... H01S 5/18308
                                                          372/50.124
2020/0028328 A1*  1/2020 Arikata ................. H01S 5/2226
2020/0099195 A1*  3/2020 Kaneko ................. H01S 5/3215
2020/0287351 A1*  9/2020 Gerlach .................. H01S 5/305
2020/0350744 A1* 11/2020 Gerlach ............. H01S 5/18361
2022/0224079 A1*  7/2022 Aoki ................... H01S 5/18361
2023/0065551 A1*  3/2023 Kaminishi .......... H01S 5/18361

OTHER PUBLICATIONS

M A Bobrov et al., "Mechanism of the polarization control in intracavity-contacted VCSEL with rhomboidal oxide current aperture", Journal of Physics: Conference Series 741 (2016) 012078.

* cited by examiner

SURFACE-EMITTING LASER WITH OPTIMIZED DBR STRUCTURE AND ENHANCED OPTICAL CONFINEMENT

TECHNICAL FIELD

The present disclosure relates to a surface-emitting laser. The present application claims the priority based on Japanese Patent Application No. 2019-116709, filed on Jun. 24, 2019, the entire contents of which are incorporated herein by reference.

BACKGROUND ART

The prior art document discloses a vertical cavity surface-emitting laser (VCSEL).

CITATION LIST

Patent Literature

PTL 1: PCT International Publication No. WO 2013/176201 A1

Non-Patent Document

NPL 1: M A Bobrov et al., "Mechanism of the polarization control in intracavity-contacted VCSEL with rhomboidal oxide current aperture", Journal of Physics: Conference Series 741 (2016) 012078

SUMMARY OF INVENTION

A surface-emitting laser according to the present disclosure includes a lower DBR layer, a cavity layer, and an upper DBR layer that are stacked in this order on top of a substrate, wherein the lower DBR layer has a first DBR layer, a contact layer, and a second DBR layer that are stacked in this order on top of the substrate, wherein each of the first DBR layer and the second DBR layer includes a plurality of first layers and a plurality of second layers that are alternately stacked, wherein each of the first layers and the second layers is a semiconductor layer including aluminum, wherein a composition ratio of the aluminum of each first layer is lower than that of the aluminum of each second layer, and wherein the second DBR layer includes 12 or more and 20 or fewer pairs of the first layers and the second layers.

DESCRIPTION OF EMBODIMENTS

Figure 1:
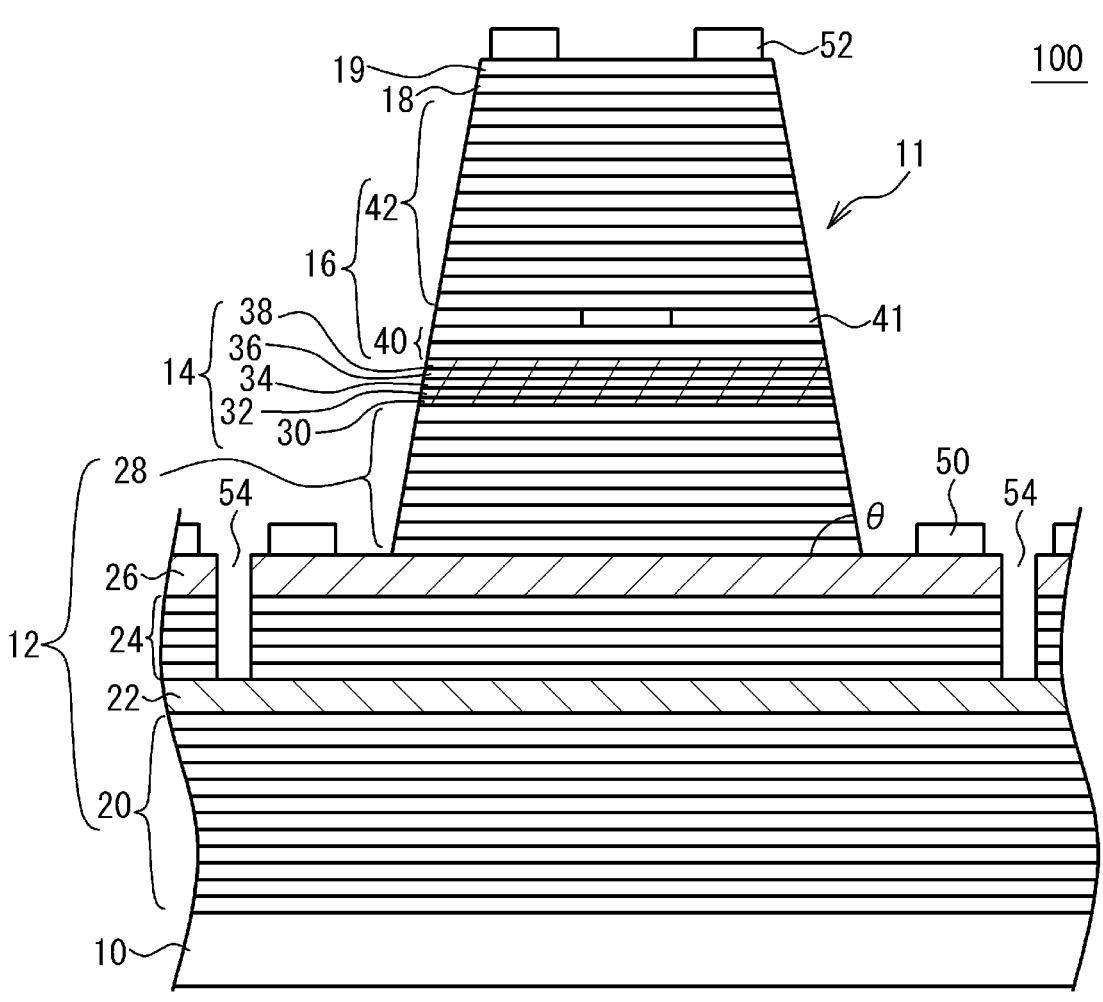
FIG. 1 is a cross-sectional view illustrating a surface-emitting laser according to an Embodiment 1.

Problems to be Solved by Present Disclosure

A vertical cavity surface-emitting laser is a type of semiconductor laser. In the surface-emitting laser, a lower distributed Bragg reflector (DBR) layer, a cavity layer including a light-emitting layer, and an upper DBR layer are stacked (PTL 1 and NPL 1). A surface-emitting laser array including a plurality of surface-emitting lasers may be formed. As described in PTL 1, in order to ensure isolation between surface-emitting lasers, a semi-insulating substrate is used, a contact layer is provided in a lower DBR layer, and an electrode is provided at the contact layer. A modulation speed of the surface-emitting laser depends on an optical confinement factor and a differential resistance. The modulation speed can be increased by increasing the optical confinement factor and reducing the differential resistance.

The DBR layer between the contact layer and the cavity layer is a series resistance component and causes an increase in the differential resistance of the surface-emitting laser. Although the differential resistance decreases by locating the contact layer closer to the cavity layer, light leaks from the cavity layer to the contact layer, and an optical confinement is degraded. It is therefore an object of the present disclosure to provide a surface-emitting laser that can achieve both an improvement in optical confinement and a reduction in resistance.

Advantageous Effects of Present Disclosure

According to the present disclosure, it is possible to achieve both the improvement in optical confinement performance and the reduction in resistance.

DESCRIPTION OF EMBODIMENTS OF PRESENT DISCLOSURE

First, embodiments of the present disclosure will be listed and described.

An aspect of the present disclosure is (1) a surface-emitting laser including a lower DBR layer, a cavity layer, and an upper DBR layer that are stacked in this order on top of the substrate. In the surface-emitting laser, the lower DBR layer has a first DBR layer, a contact layer, and a second DBR layer that are stacked in this order on top of the substrate. Each of the first DBR layer and the second DBR layer includes a plurality of first layers and a plurality of second layers that are alternately stacked. Each of the first layers and the second layers is a semiconductor layer including aluminum. A composition ratio of the aluminum of each first layer is lower than that of the aluminum of each second layer. The second DBR layer includes 12 or more and 20 or fewer pairs of the first layers and the second layers. By providing the second DBR layer including 12 or more pairs, the contact layer is away from the cavity layer. Accordingly, light leakage to the contact layer is suppressed, and an optical confinement performance is improved. Since the number of pairs of the second DBR layers is 20 or fewer, an increase in resistance is suppressed. Therefore, it is possible to achieve both the optical confinement performance and the low resistance.

(2) An optical path length from the contact layer to the cavity layer may be greater than or equal to 6 times and less than or equal to 10 times an oscillation wavelength of the cavity layer. It is possible to achieve both the optical confinement performance and the low resistance.

(3) The lower DBR layer may include 30 or more pairs of the first layers and the second layers. A reflectance of the lower DBR layer is increased.

(4) The contact layer may include aluminum gallium arsenide, and a composition ratio of aluminum may be less than or equal to 0.2. This reduces a resistance of the contact layer and improves heat dissipation.

(5) An optical path length of the cavity layer may be less than or equal to half of an oscillation wavelength of the cavity layer. Light can be confined in the cavity layer.

(6) The cavity layer may include a first spacer layer, a second spacer layer, a light-emitting layer, a third spacer layer, and a fourth spacer layer that are stacked in this order from a side of the lower DBR. Each of the first spacer layer and the fourth spacer layer may be an aluminum gallium arsenide layer having a composition of aluminum that is greater than or equal to 0.75 and less than or equal to 0.95. Each of the second spacer layer and the third spacer layer may be an aluminum gallium arsenide layer having a composition of aluminum that is greater than or equal to 0.25 and less than or equal to 0.45. The light-emitting layer may be a quantum well light-emitting layer. Light can be confined in the cavity layer.

(7) An optical confinement factor of the contact layer may be less than or equal to 1%, and an optical confinement factor of the light-emitting layer may be greater than or equal to 3.14% and less than or equal to 3.18%. Light can be confined in the cavity layer.

(8) A ratio of an optical confinement factor to a thickness of the contact layer may be less than or equal to 2%/$\mu$m. A ratio of an optical confinement factor of the light-emitting layer to a total thickness of well layers included in the light-emitting layer may be greater than or equal to 143%/$\mu$m and less than or equal to 145%/$\mu$m. Light can be confined in the cavity layer.

(9) The second DBR layer may include n-type aluminum gallium arsenide. The upper DBR layer may include p-type aluminum gallium arsenide and an oxide confinement layer. An aluminum composition ratio of the second DBR layer may be lower than that of the upper DBR layer. Concentration of stress generated by oxidation for forming the oxide confinement layer can be relaxed.

(10) The second DBR layer, the cavity layer, and the upper DBR layer may form a mesa. An angle between a side wall of the mesa and a bottom surface of the mesa may be greater than or equal to 70° and less than or equal to 80°. Concentration of stress can be relaxed.

(11) The number of the first layers included in the second DBR layer may be equal to the number of the second layers included in the second DBR layer.

DETAILS OF EMBODIMENTS OF PRESENT DISCLOSURE

Specific examples of a surface emitting laser according to an embodiment of the present disclosure will be described below with reference to the drawings. It should be noted that the present disclosure is not limited to these examples, and is defined by Claims, and is intended to embrace all the modifications within the meaning and range of equivalency of the Claims.

Embodiment 1

(Surface-Emitting Laser)

FIG. 1 is a cross-sectional view illustrating a surface-emitting laser 100 according to an Embodiment 1. As illustrated in FIG. 1, a lower DBR layer 12, a cavity layer 14, an upper DBR layer 16, a p-type contact layer 18, and a cap layer 19 are stacked in this order on top of a substrate 10. Lower DBR layer 12 includes an i-type DBR layer 20, an etching stop layer 22, an n-type DBR layer 24 (first DBR layer), an n-type contact layer 26, and an n-type DBR layer 28 (second DBR layer) which are stacked in this order on top of substrate 10.

Cavity layer 14 includes spacer layers 30 and 32 (a first spacer layer and a second spacer layer, respectively), a light-emitting layer 34, and spacer layers 36 and 38 (a third spacer layer and a fourth spacer layer, respectively) which are stacked in this order on top of lower DBR layer 12. Upper DBR layer 16 includes a spacer layer 40 and a p-type DBR layer 42 which are stacked in this order on top of cavity layer 14. Electrodes 50 are provided on n-type contact layer 26, and electrodes 52 are provided on cap layer 19.

N-type DBR layer 28, cavity layer 14, upper DBR layer 16, p-type contact layer 18, and cap layer 19 form a mesa 11. Mesa 11 has, for example, a trapezoidal shape, and an angle $\theta$ between the side wall and the bottom surface is greater than or equal to 70° and less than or equal to 80°. An oxide confinement layer 41 is formed at a part of upper DBR layer 16. Oxide confinement layer 41 extends from the side surface of mesa 11 toward the center of mesa 11, and a unoxidized portion between oxide confinement layers 41 serves as an aperture. Since a current is harder to flow through oxide confinement layer 41 than a portion which is not oxidized, the aperture becomes a current path, and efficient current injection is possible.

By applying a drive signal to electrodes 50 and 52, laser light is emitted from cavity layer 14 in a vertical direction. An oscillation wavelength of surface-emitting laser 100 is, for example, from 830 nm to 930 nm, and a modulation speed is, for example, from 17 GHz to 18 GHz when an aperture size is 7 $\mu$m, with a bias current is 8 mA, and surface-emitting laser 100 is operated at room temperature. In the following embodiment, the case where an oscillation wave length is 850 nm will be described unless otherwise specified.

A surface-emitting laser array in which a plurality of surface-emitting lasers 100 are arranged is formed on substrate 10, and one surface-emitting laser 100 is illustrated in FIG. 1. Substrate 10, DBR layer 20, and etching stop layer 22 are shared by the plurality of surface-emitting lasers 100. Grooves 54 which reach etching stop layer 22 are formed in n-type DBR layer 24 and n-type contact layer 26, and grooves 54 separate surface-emitting lasers 100 from each other.

By providing etching stop layer 22 in a middle of lower DBR layer 12 to stop etching there, an amount of etching for isolation can be reduced. Conventionally, etching is performed until it reaches substrate 10 for the purpose of electrical isolation. In this case, it is necessary to etch an epilayer having a total thickness of 10 $\mu$m. Since it is necessary to secure a margin of side etching, an effective region in a wafer surface is narrowed, and thus a yield is lowered. Furthermore, the lower DBR layer formed by epitaxial growth has a strain in the layer. When etching is performed up to substrate 10, all the strains present in the total thickness of 10 $\mu$m are released. The release of the strains cause, for example, film peeling at chip edge faces. By providing etching stop layer 22 as in the present embodiment, an etching time can be shortened and a throughput can be increased. In addition, the side etching can be minimized and the effective area can be increased. Further, various adverse effects due to the strain release can be reduced.

Table 1 illustrates an example of the layer structure of surface-emitting laser 100.

TABLE 1

| Layer | Material | Dopant concentration (cm$^{-3}$) |
|---|---|---|
| Cap layer 19 | GaAs | C: $4.5 \times 10^{19}$ |
| P-type contact layer 18 | Al$_{0.16}$Ga$_{0.84}$As | C: $4.5 \times 10^{19}$ |
| P-type DBR layer 42 | Al$_{0.16}$Ga$_{0.84}$As/ Al$_{0.9}$Ga$_{0.1}$As 23 pairs | C: $1.4 \times 10^{18}$/ $1.0 \times 10^{19}$ |
| Oxide confinement layer 41 | Al$_{0.6}$Ga$_{0.4}$As Al$_{0.98}$Ga$_{0.02}$As Al$_{0.6}$Ga$_{0.4}$As | C: $2.6 \times 10^{18}$ C: $5.0 \times 10^{18}$ C: $2.6 \times 10^{18}$ |
| Spacer layer 40 | Al$_{0.16}$Ga$_{0.84}$As | C: $8.0 \times 10^{17}$ |
| Spacer layer 38 | Al$_{0.88}$Ga$_{0.12}$As | C: $5.0 \times 10^{18}$ |
| Spacer layer 36 | Al$_{0.41}$Ga$_{0.59}$As/ | |
| Light-emitting layer 34 | InAlGaAs/ Al$_{0.41}$Ga$_{0.59}$As 4 pairs | |
| Spacer layer 32 | Al$_{0.41}$Ga$_{0.59}$As | |
| Spacer layer 30 | Al$_{0.88}$Ga$_{0.12}$As | Si: $1.3 \times 10^{18}$ |
| N-type DBR layer 28 | Al$_{0.16}$Ga$_{0.84}$As/ Al$_{0.88}$Ga$_{0.12}$As (8 + N) pairs | Si: $1.8 \times 10^{18}$/ $1.3 \times 10^{18}$ |
| N-type contact layer 26 | Al$_{0.1}$Ga$_{0.9}$As | Si: $3.0 \times 10^{18}$ |
| N-type DBR layer 24 | Al$_{0.16}$Ga$_{0.84}$As/ Al$_{0.9}$Ga$_{0.1}$As 4 pairs | Si: $1.8 \times 10^{18}$/ $1.3 \times 10^{18}$ |
| Etching stop layer 22 | Al$_{0.16}$Ga$_{0.84}$As | |
| DBR layer 20 | Al$_{0.16}$Ga$_{0.84}$As/ Al$_{0.9}$Ga$_{0.1}$As (25 − N) pairs | |
| Substrate 10 | GaAs | |

As illustrated in Table 1, substrate 10 is a semi-insulating semiconductor substrate formed of, for example, gallium arsenide (GaAs). DBR layer 20 and etching stop layer 22 of lower DBR layer 12 are formed of undoped aluminum gallium arsenide (AlGaAs). Etching stop layer 22 may be a p-type. N-type DBR layers 24 and 28 and n-type contact layer 26 are formed of n-type AlGaAs doped with silicon (Si).

Each of DBR layer 20 and n-type DBR layer 24 (first DBR layer) is formed by alternately stacking, for example, an Al$_{0.16}$Ga$_{0.84}$As layer (first layer) having an Al composition ratio of 0.16 and an Al$_{0.9}$Ga$_{0.1}$As layer (second layer) having an Al composition ratio of 0.9. The number of pairs of two types of AlGaAs layers in DBR layer 20 is (25−N). Here, the N is a natural number, and a specific value will be described later. The number of pairs in n-type DBR layer 24 is, for example, four. N-type DBR layer 28 is formed by alternately stacking, for example, an Al$_{0.16}$Ga$_{0.84}$As layer (first layer) having an Al composition ratio of 0.16 and an Al$_{0.88}$Ga$_{0.12}$As layer (second layer) having an Al composition ratio of 0.88, and the number of pairs of two types of AlGaAs layers is (8+N).

The N is a natural number, and is preferably an integer of 4 or more and 12 or fewer, for example. That is, the number of pairs of DBR layers 20 is, for example, 13 or more and 21 or fewer, and the number of pairs of n-type DBR layers 28 is, for example, 12 or more and 20 or fewer. Since the number of pairs of n-type DBR layer 28 is from 12 to 20, the optical path length from n-type contact layer 26 to the center of cavity layer 14 in a thickness direction is greater than or equal to 6 times and less than or equal to 10 times the oscillation wavelength λ (greater than or equal to 12 times and less than or equal to 20 times a half wavelength). Note that the optical path length in a plurality of layers is a value obtained by summing up an optical path length (a value obtained by multiplying a thickness by a refractive index) in each layer.

An Al composition ratio of n-type contact layer 26 is lower than those of n-type DBR layers 24 and 28, for example, 0.1, and preferably 0.2 or less. A dopant concentration of n-type contact layer 26 is higher than that of n-type DBR layers 24 and 28, and $3.0 \times 10^{18}$ cm$^{-3}$, for example. A thickness of n-type contact layer 26 is, for example, 480 nm.

Spacer layer 30 in cavity layer 14 is formed of n-type Al$_{0.88}$Ga$_{0.12}$As doped with Si. Spacer layers 32 and 36 are formed of undoped Al$_{0.41}$Ga$_{0.59}$As. Spacer layer 38 is formed of p-type Al$_{0.88}$Ga$_{0.12}$As doped with C. Al composition ratios of spacer layers 30 and 38 are preferably, for example, greater than or equal to 0.75 and less than or equal to 0.9. Al composition ratios of spacer layers 32 and 36 are preferably, for example, greater than or equal to 0.25 and less than or equal to 0.45. Light-emitting layer 34 is a quantum well active layer that includes four indium aluminum gallium arsenide (InAlGaAs) layers (well layers) and three Al$_{0.41}$Ga$_{0.59}$As layers (barrier layers) formed between the respective well layers. A thickness of each InAlGaAs layer is, for example, 5.5 nm, and a thicknesses of each Al$_{0.41}$Ga$_{0.59}$As layer is, for example, 4 nm. An Al composition ratio is, for example, 0.41, and is preferably greater than or equal to 0.25 and less than or equal to 0.45. The number of the well layers is not limited to four. For example, the number of the well layers may be 3 or fewer, or 5 or more.

Spacer layer 40, oxide confinement layer 41, p-type DBR layer 42, and p-type contact layer 18 in upper DBR layer 16 are formed of p-type AlGaAs doped with carbon (C). Oxide confinement layer 41 includes, for example, three AlGaAs layers stacked in order, and Al composition ratios thereof are 0.6, 0.98, and 0.6, respectively. P-type DBR layer 42 is formed by alternately stacking Al$_{0.16}$Ga$_{0.84}$As layers each having an Al composition ratio of 0.16 and Al$_{0.9}$Ga$_{0.1}$As layers each having an Al composition ratio of 0.9, and the number of pairs is 23.

Cap layer 19 is formed of p-type GaAs doped with C. Dopant concentrations of p-type contact layer 18 and cap layer 19 are higher than that of p-type DBR layer 42, and $4.5 \times 10^{19}$ cm$^{-3}$, for example.

Thickness of each layer can be set in the following range, for example.

16%-Al layer of n-type DBR layer 28: 60 nm to 63 nm
88%-Al layer of n-type DBR layer 28: 68 nm to 71 nm
N-type contact layer 26: 470 nm to 490 nm
16%-Al layer of n-type DBR layer 24: 60 nm to 63 nm
90%-Al layer of n-type DBR layer 24: 69 nm to 72 nm
Etching stop layer 22: 240 nm to 250 nm
16%-Al layer of DBR layer 20: 60 nm to 63 nm
90%-Al layer of DBR layer 20: 69 nm to 72 nm
Well layer: 3 nm to 7 nm
Barrier layer: 3 nm to 7 nm
Each of spacer layers 32 and 36: 30 nm to 40 nm
Each of spacer layers 30 and 38: 5 nm to 25 nm Composition ratios may not be constant in each layer, and may vary in a thickness direction, for example. Thus, lattice matching between layers can be achieved. Also, varying the composition ratios in DBR layers can prevent a formation of steep heterojunction interface, which can reduce a resistance. For example, in lower DBR layer 12, the Al composition ratio is lowered to be close to 0.16 in a portion inside an Al$_{0.9}$Ga$_{0.1}$As layer close to an Al$_{0.16}$Ga$_{0.84}$As layer.

The compound semiconductor layers illustrated in FIG. 1 and Table 1 are epitaxially grown on substrate 10 by, for example, a metal organic chemical vapor deposition (MOCVD) method or a molecular beam epitaxy (MBE) method. For example, the number of pairs can be increased or decreased by controlling a flow rate of source gases and a growth time. Mesa 11 and groove 54 are formed by etching. For example, oxide confinement layer 41 is formed by overheating in a water vapor atmosphere to oxidize a part of upper DBR layer 16.

Comparative Example

Figure 2:
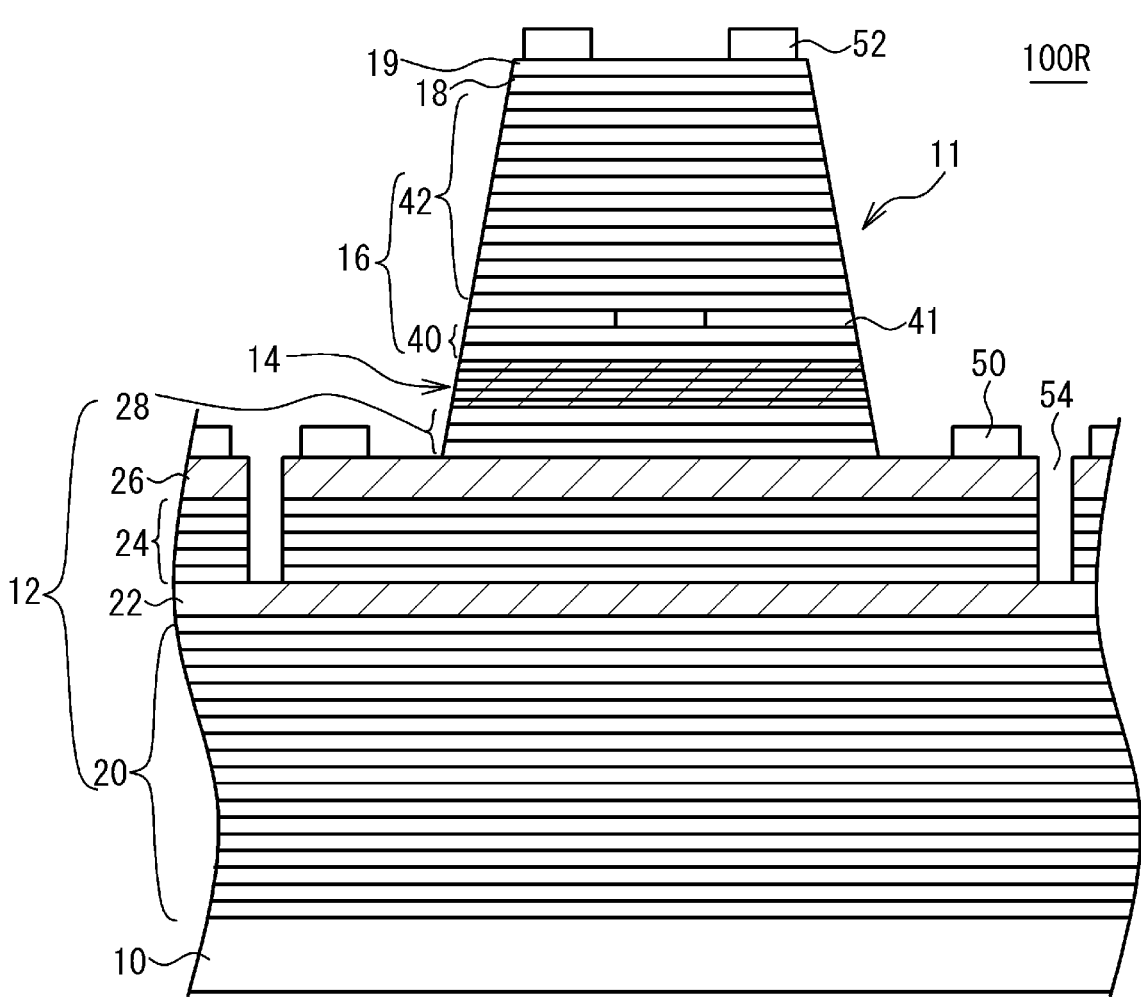
FIG. 2 is a cross-sectional view illustrating a surface-emitting laser according to a Comparative Example 1.

FIG. 2 is a cross-sectional view illustrating a surface-emitting laser 100R according to Comparative Example 1. Differences between surface-emitting laser 100R and surface-emitting laser 100 according to Embodiment 1 are the number of pairs in DBR layer 20 and the number of pairs in n-type DBR layer 28.

Table 2 illustrates an example of the layer structure of surface-emitting laser 100R.

TABLE 2

| Layer | Material | Dopant concentration (cm$^{-3}$) |
|---|---|---|
| Cap layer 19 | GaAs | C: $4.5 \times 10^{19}$ |
| P-type contact layer 18 | Al$_{0.16}$Ga$_{0.84}$As | C: $4.5 \times 10^{19}$ |
| P-type DBR layer 42 | Al$_{0.16}$Ga$_{0.84}$As/ Al$_{0.9}$Ga$_{0.1}$As 23 pairs | C: $1.4 \times 10^{18}$/ $1.0 \times 10^{19}$ |
| Oxide confinement layer 41 | Al$_{0.6}$Ga$_{0.4}$As Al$_{0.98}$Ga$_{0.02}$As Al$_{0.6}$Ga$_{0.4}$As | C: $2.6 \times 10^{18}$ C: $5.0 \times 10^{18}$ C: $2.6 \times 10^{18}$ |
| Spacer layer 40 | Al$_{0.16}$Ga$_{0.84}$As | C: $8.0 \times 10^{17}$ |
| Spacer layer 38 | Al$_{0.88}$Ga$_{0.12}$As | C: $5.0 \times 10^{18}$ |
| Spacer layer 36 | Al$_{0.41}$Ga$_{0.59}$As | |
| Light-emitting layer 34 | InAlGaAs/ Al$_{0.41}$Ga$_{0.59}$As 4 pairs | |
| Spacer layer 32 | Al$_{0.41}$Ga$_{0.59}$As | |
| Spacer layer 30 | Al$_{0.88}$Ga$_{0.12}$As | Si: $1.3 \times 10^{18}$ |
| N-type DBR layer 28 | Al$_{0.16}$Ga$_{0.84}$As/ Al$_{0.88}$Ga$_{0.12}$As 8 pairs | Si: $1.8 \times 10^{18}$/ $1.3 \times 10^{18}$ |
| N-type contact layer 26 | Al$_{0.1}$Ga$_{0.9}$As | Si: $3.0 \times 10^{18}$ |
| N-type DBR layer 24 | Al$_{0.16}$Ga$_{0.84}$As/ Al$_{0.9}$Ga$_{0.1}$As 4 pairs | Si: $1.8 \times 10^{18}$/ $1.3 \times 10^{18}$ |
| Etching stop layer 22 | Al$_{0.16}$Ga$_{0.84}$As | |
| DBR layer 20 | Al$_{0.16}$Ga$_{0.84}$As/ Al$_{0.9}$Ga$_{0.1}$As 25 pairs | |
| Substrate 10 | GaAs | |

As illustrated in Table 2, the number of pairs of DBR layer 20 is 25, and the number of pairs of n-type DBR layer 28 is 8. As compared with Embodiment 1, the number of pairs in n-type DBR layer 28 is fewer, and the optical path length from n-type contact layer 26 to the center of cavity layer 14 is short.

Figure 3A:
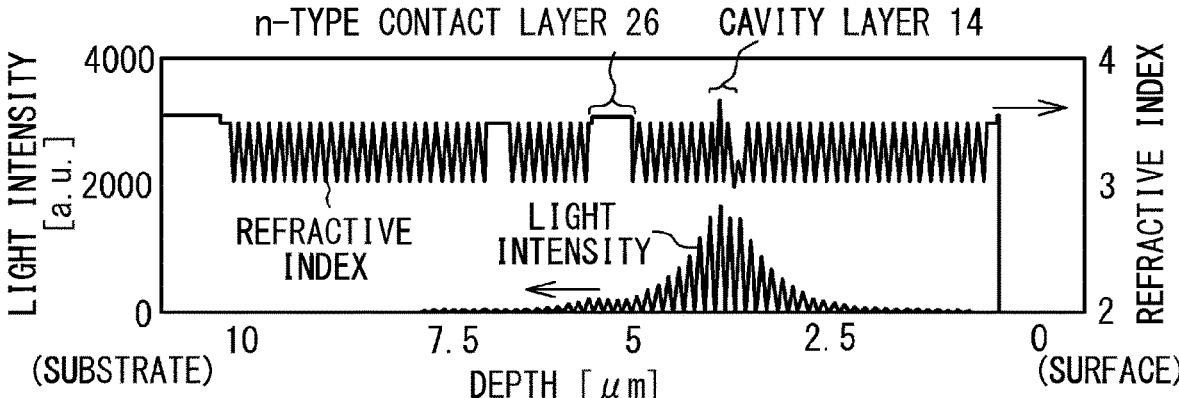
FIG. 3A is a diagram illustrating a result of a simulation of a refractive index and a light intensity in Comparative Example 1.
Figure 3B:
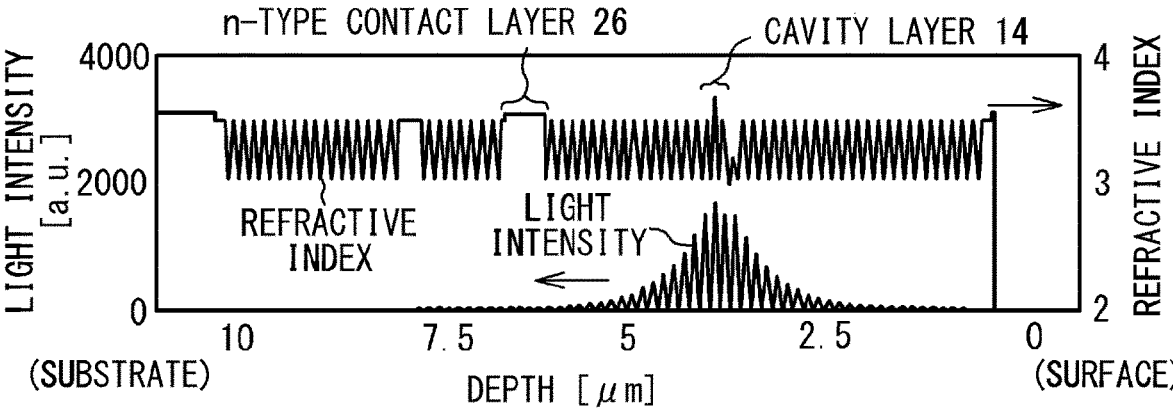
FIG. 3B is a diagram illustrating a result of a simulation of a refractive index and a light intensity in Embodiment 1.

Next, light intensity will be described. FIG. 3A is a diagram illustrating a result of a simulation of the refractive index and the light intensity in Comparative Example 1, and FIG. 3B is a diagram illustrating a result of a simulation of the refractive index and the light intensity in Embodiment 1. The horizontal axis represents a depth from the surface of the surface-emitting laser, a left end thereof represents a bottom surface of substrate 10, and a right end thereof represents the surface of the surface-emitting laser. The left vertical axis represents the light intensity. The light intensity indicated by the solid line is a result calculated by a one-dimensional transfer matrix method. The right vertical axis represents the refractive index.

As illustrated in FIG. 3A, the light intensity is large in cavity layer 14, and attenuates with distance from cavity layer 14. A portion whose depth is around 5 μm is n-type contact layer 26 and has a higher refractive index than the other layers. Light leaks from cavity layer 14 to n-type contact layer 26, and the light intensity is maintained at a constant magnitude in n-type contact layer 26.

As illustrated in FIG. 3B, also in Embodiment 1, the light intensity is large in cavity layer 14, and attenuates with distance from cavity layer 14. N-type contact layer 26 is away from cavity layer 14 and, for example, located near a depth of 6 μm. Therefore, light hardly spreads to n-type contact layer 26, and the light intensity in n-type contact layer 26 is lower than that in Comparative Example 1.

Next, an optical confinement factor F will be described. The optical confinement factors Γ in light-emitting layer 34 and n-type contact layer 26 are calculated by the following equation, respectively.

$$\Gamma 1 = \text{(integral value of light intensity in well layers included in light-emitting layer 34)/(integral value of light intensity in all layers).}$$

(1) Optical confinement factor Γ1 of light-emitting layer 34

$$\Gamma 2 = \text{(integral value of light intensity in } n\text{-type contact layer 26)/(integral value of light intensity in all layers).}$$

(2) Optical confinement factor Γ2 of n-type contact layer 26

Here, a VCSEL has a resonator structure in which light is confined in cavity layer 14 surrounded by the upper and lower DBR layers each having a function of a reflecting minor, however in a device operation, photoelectric conversion from an injected current occurs only in well layers in a light-emitting layer. Therefore, the optical confinement factor of the well layer in light-emitting layer 34 is an index of the high-speed modulation performance of the VCSEL. Since light-emitting layer 34 is positioned at the center of cavity layer 14, the optical confinement factor of light-emitting layer 34 can be increased by collecting light in cavity layer 14.

Optical confinement factors Γ1 of light-emitting layer 34 were calculated in Embodiment 1 and Comparative Examples 1 and 2. Comparative Example 2 does not have n-type contact layer 26, and other layer structures are the same as those of Comparative Example 1.

Figure 4A:
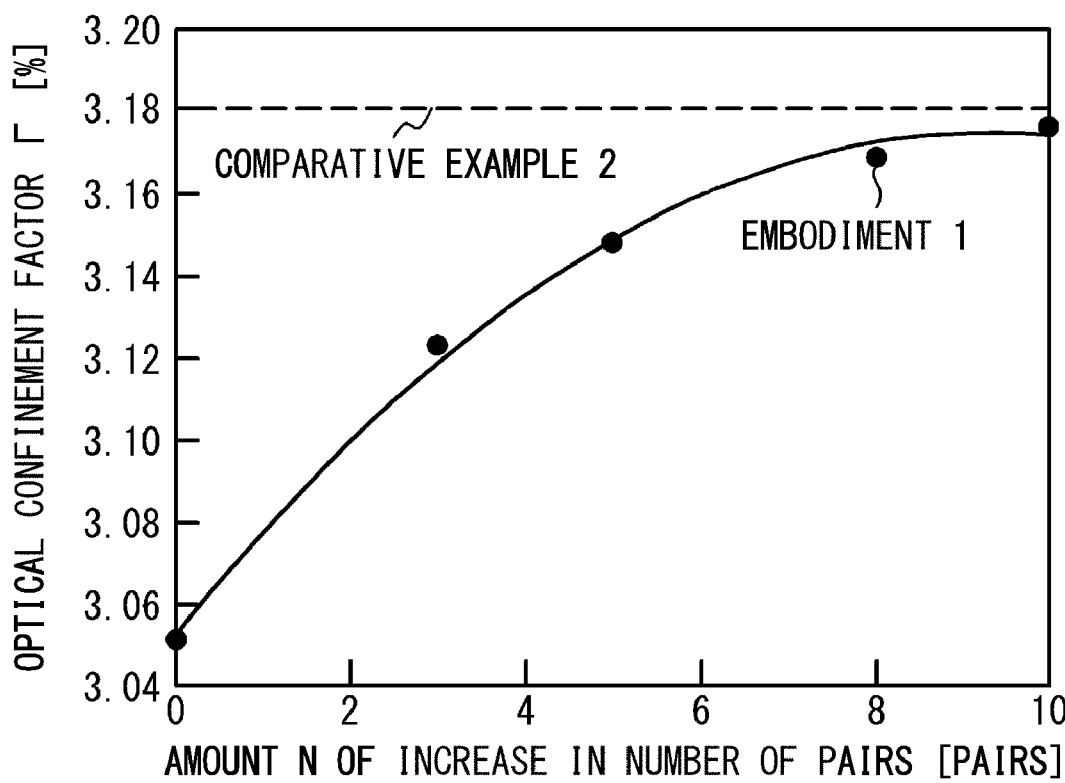
FIG. 4A is a diagram illustrating a result of a simulation of an optical confinement factor.

FIG. 4A is a diagram illustrating a result of a simulation of the optical confinement factor of light-emitting layer 34. The horizontal axis represents N of DBR layer 20 and n-type DBR layer 28 in Table 1, and represents the amount of change in the number of pairs from Comparative Examples 1 and 2. That is, at N=0 in FIG. 4A, DBR layer 20 has 25 pairs and n-type DBR layer 28 has 8 pairs, as in Comparative Example 1 in Table 2. The vertical axis represents optical confinement factor Γ1 of light-emitting layer 34.

Optical confinement factor Γ of Comparative Example 2 indicated by the broken line is constant at 3.1812%. In Comparative Example 2, since n-type contact layer 26 is not provided, light does not spread from cavity layer 14 to n-type contact layer 26, and thus optical confinement factor Γ becomes a constant value. On the other hand, optical confinement factor Γ of Comparative Example 1 (N=0) is 3.0515%, which is lower than that of Comparative Example 2. This is because light leaks out to n-type contact layer 26 as illustrated in FIG. 3A.

In FIG. 4A, a calculation result of Embodiment 1 is represented by circles, and a solid line is a curve obtained by fitting the result of Embodiment 1 with a quadratic function by a least square method. In Embodiment 1, N varies from zero to 10. As the N increases, optical confinement factor $\Gamma1$ increases and approaches that in Comparative Example 2. Optical confinement factor $\Gamma1$ at N=8 is 3.1692%, which is higher than that in Comparative Example 1 and almost equal to that in Comparative Example 2.

Figure 5:
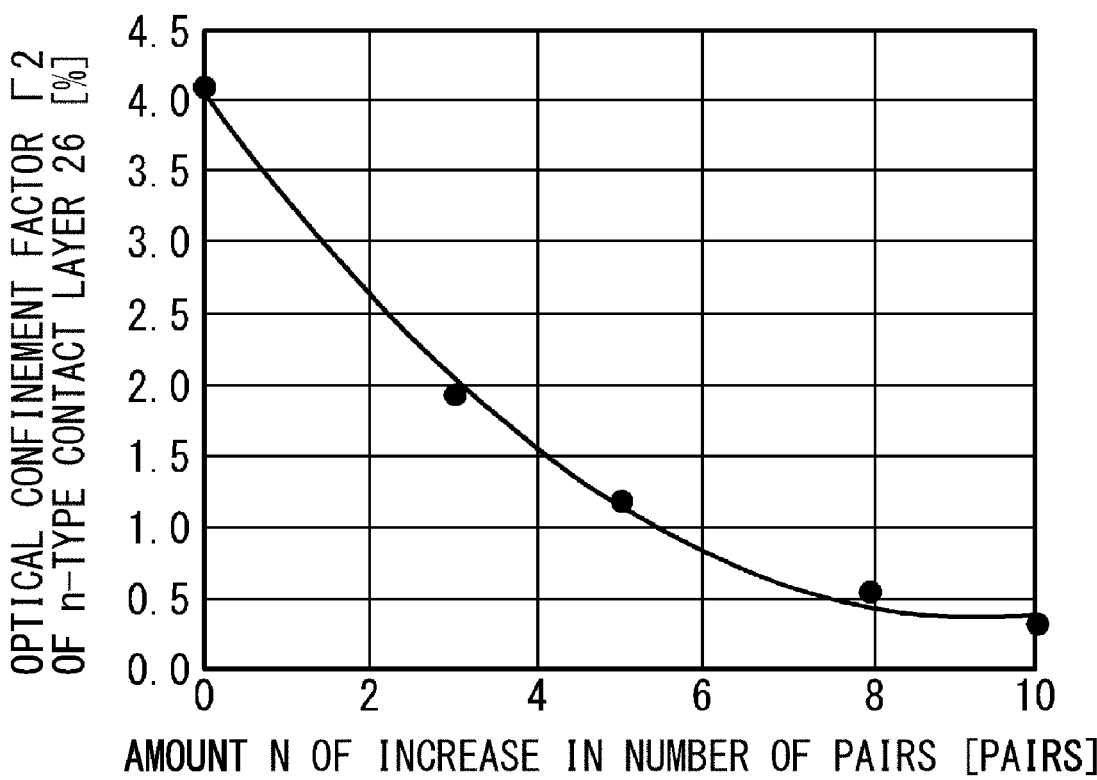
FIG. 5 is a diagram illustrating a result of a simulation of an optical confinement factor of an n-type contact layer.

FIG. 5 is a diagram illustrating a result of a simulation of the optical confinement factor of n-type contact layer 26. The horizontal axis represents N of DBR layer 20 and n-type DBR layer 28 in Table 1, and represents the amount of change in the number of pairs from Comparative Examples 1 and 2. That is, in the case of N=0 in FIG. 5, DBR layer 20 has 25 airs and n-type DBR layer 28 has 8 pairs as in Comparative Example 1 in Table 2. The vertical axis represents optical confinement factor $\Gamma2$ of n-type contact layer 26.

In FIG. 5, a calculation result of Embodiment 1 is represented by circles, and a solid line is a curve obtained by fitting the result of Embodiment 1 with a quadratic function by the least square method. In Embodiment 1, N varies from zero to 10. As N increases, optical confinement factor $\Gamma2$ decreases. When the optical confinement factor of n-type contact layer 26 is suppressed to 1% or less, the leakage of light from cavity layer 14 to n-type contact layer 26 can be sufficiently ignored, and the optical confinement performance of cavity layer 14 can be improved.

Accordingly, light can be concentrated on cavity layer 14, and the light intensity of n-type contact layer 26 can be reduced. The optical confinement factor of light-emitting layer 34 in Embodiment 1 is, for example, greater than or equal to 3.14% and less than or equal to 3.18%, and the optical confinement factor of n-type contact layer 26 is, for example, less than or equal to 1%. The optical confinement performance of a layer is defined by the ratio of an optical confinement factor to a thickness of the layer as illustrated in the following equation.

$$\text{Optical confinement performance=optical confinement factor/thickness}$$

Specifically, the optical confinement performance of light-emitting layer 34 is obtained by (optical confinement factor $\Gamma1$ of light-emitting layer 34)/(the total thickness of the well layers included in light-emitting layer 34). The optical confinement performance of n-type contact layer 26 is obtained by (optical confinement factor $\Gamma2$ of n-type contact layer 26)/(thickness of n-type contact layer 26).

The optical confinement performance of light-emitting layer 34 in Embodiment 1 is, for example, greater than or equal to 143%/μm and less than or equal to 145%/μm, and the optical confinement performance of n-type contact layer 26 is, for example, less than or equal to 2%/μm.

By increasing N and increasing the number of pairs of n-type DBR layers 28 in this manner, n-type contact layer 26 can be away from cavity layer 14 to collect light in cavity layer 14. However, n-type DBR layer 28 between n-type contact layer 26 and cavity layer 14 becomes a resistance component. An increase in the number of pairs of n-type DBR layers 28 may increase a differential resistance of the surface-emitting laser. The modulation speed of the surface-emitting laser depends on the inverse number of the differential resistance, and there is a possibility that the modulation speed decreases due to an increase in the differential resistance. For example, the optical confinement factor can be increased by providing n-type contact layer 26 directly on substrate 10 without interposing a DBR layer and providing a lower DBR layer including 30 or more pairs between n-type contact layer 26 and cavity layer 14. However, the entire lower DBR layer becomes the resistance component, and the differential resistance increases greatly.

Figure 4B:
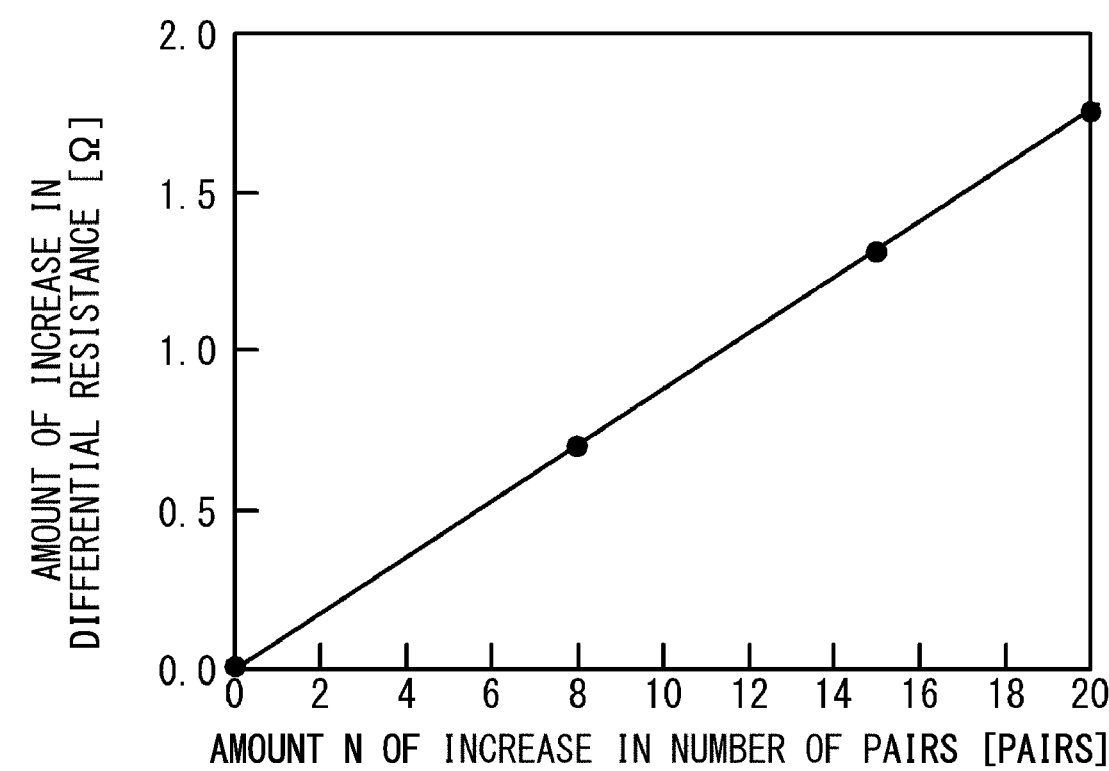
FIG. 4B is a diagram illustrating a result of a simulation of a differential resistance.

FIG. 4B illustrates a result of a simulation of the differential resistance. The horizontal axis represents an amount of increase N in the number of pairs of DBR layer 20 and n-type DBR layer 28 in Table 1. The vertical axis represents an amount of increase in the differential resistance of the surface-emitting laser in Embodiment 1 when Comparative Example 1 is set to zero. The differential resistance was calculated using a two-dimensional device simulator by setting an aperture diameter of surface-emitting laser 100 to 7 μm in a cylindrical coordinate system. As illustrated in FIG. 4B, the differential resistance is proportional to N, and as N increases, the differential resistance also increases. For example, in N=8, the amount of increase in the differential resistance is 0.8Ω or less. When N exceeds 12, the differential resistance increases by 1Ω or greater as compared with Comparative Example 1.

As the number of pairs (8+N) of n-type contact layer 26 increases, the optical confinement factor of cavity layer 14 increases, but the differential resistance also increases. For example, in N=4, optical confinement factor $\Gamma$ is about 3.14%, which is sufficiently higher than that in Comparative Example 1. When N is 8 or more, the optical confinement factor approaches 3.1812% of Comparative Example 2, and when N further increases, the optical confinement factor saturates near 3.1812%. On the other hand, the differential resistance increases in proportion to N. For example, when N is increased to 15 or more, the optical confinement factor is about the same as that in the case of N=10, but the differential resistance is increased by 1Ω or greater as compared with Comparative Example 1. Therefore, N is preferably 12 or less.

According to Embodiment 1, n-type DBR layer 28 between n-type contact layer 26 and cavity layer 14 includes the Al0.16Ga0.84As layer and the Al0.88Ga0.12As layer, and the number of pairs is 12 or more and 20 or fewer. That is, in Table 1, FIG. 4A and FIG. 4B, N is 4 or more and 12 or fewer. Thus, the optical confinement factor of cavity layer 14 can be set to, for example, 3.14% to 3.1812%. In addition, the amount of increase in the differential resistance can be suppressed to about 1Ω at most. That is, it is possible to achieve both the improvement in optical confinement performance in cavity layer 14 and the reduction in resistance.

For example, in N=8, the number of pairs of n-type DBR layers 28 is 16, and the number of pairs of DBR layers 20 is 17. In this case, the optical confinement factor is 3.1692%, and the amount of increase in the differential resistance is about 0.8Ω. That is, the optical confinement performance of surface-emitting laser 100 can be enhanced and the resistance can be reduced. The number of pairs may be 12 pairs or more and 20 pairs or fewer, or 14 pairs or more and 18 pairs or fewer. In the example illustrated in Table 1, the number of $Al_{0.16}Ga_{0.84}As$ layers included in n-type DBR layer 28 is equal to the number of $Al_{0.88}Ga_{0.12}As$ layers included in n-type DBR layer 28. The number of $Al_{0.16}Ga_{0.84}As$ layers included in n-type DBR layer 28 may be different from the number of $Al_{0.88}Ga_{0.12}As$ layers included in n-type DBR layer 28.

The optical path length from n-type contact layer 26 to cavity layer 14 is greater than or equal to 6 times and less than or equal to 10 times the oscillation wavelength. This makes it possible to achieve both the improvement in confinement performance and the reduction in resistance.

The optical path length may be greater than or equal to 7 times and less than or equal to 9 times the oscillation wavelength.

The total numbers of pairs of DBR layer 20 and n-type DBR layers 24 and 28, that is, the number of pairs of lower DBR layer 12 is 30 or more, preferably 35 or more. In the example of Table 1, the total number of pairs is 37. Since lower DBR layer 12 having 30 or more pairs has a high reflectance, loss of light is reduced.

N-type contact layer 26 is preferably formed of AlGaAs and has an Al composition ratio of 0.2 or less. The lower the Al composition ratio, the higher the light absorption rate of n-type contact layer 26, but the lower the resistance. According to the Embodiment 1, the number of pairs of n-type DBR layers 28 is increased so that n-type contact layer 26 is away from cavity layer 14. Accordingly, light absorption by n-type contact layer 26 is reduced. Therefore, the Al composition ratio of n-type contact layer 26 can be reduced to 0.2 or less, and the resistance can be reduced. The Al composition ratio may be, for example, 0.1 or less, or may be equal to zero. In order to improve a heat dissipation property, the Al composition is particularly preferably zero. This is because when AlGaAs has an Al composition of zero, that is, in the case of GaAs which is a binary compound, the heat dissipation property is particularly improved.

When cavity layer 14 is excessively thick, a delay of photoelectric conversion increases and the modulation speed decreases. Therefore, the optical path length of cavity layer 14 in the thickness direction is preferably half or less of the oscillation wavelength. Cavity layer 14 is formed by stacking spacer layers 30 and 32, light-emitting layer 34, and spacer layers 36 and 38, and the total optical path length of these layers is set to a half or less of the oscillation wavelength.

Light-emitting layer 34 has the optical confinement factor of 3.14% or greater and 3.18% or less, and n-type contact layer 26 has the optical confinement factor of 1% or less. The optical confinement performance of light-emitting layer 34 is greater than or equal to 143%/μm and less than or equal to 145%/μm, and the optical confinement performance of n-type contact layer 26 is 2%/μm or less. Light is confined in cavity layer 14, and a leakage of light to n-type contact layer 26 can be suppressed.

The plurality of surface-emitting lasers 100 are arrayed. Since substrate 10 is a semi-insulating substrate, a crosstalk between surface-emitting lasers 100 is suppressed. Electrodes 50 may be provided on n-type contact layer 26 isolated for each surface-emitting laser 100 by grooves 54. Surface-emitting laser 100 may be a single chip without being arrayed.

DBR layer 20, n-type DBR layers 24 and 28, n-type contact layer 26, and upper DBR layer 16 are formed of AlGaAs. In these layers, pairs of layers having different Al composition ratios are formed. The semiconductor layer of surface-emitting laser 100 may be formed of compound semiconductor layers other than those illustrated in Table 1.

Upper DBR layer 16 is formed of AlGaAs and includes oxide confinement layer 41. N-type DBR layer 28 is formed of AlGaAs and has a low Al composition ratio. More specifically, the Al composition ratio of n-type DBR layer 28 is, for example, 0.88 at a maximum, and is lower than 0.98 which is a maximum value of upper DBR layer 16. In the formation of oxide confinement layer 41, a part of upper DBR layer 16 is oxidized. At this time, a part of n-type DBR layer 28 is also oxidized. Since the Al composition ratio is low, the length of the oxidized part of n-type DBR layer 28 becomes shorter than that of upper DBR layer 16. As a result, a concentration of stress on the mesa can be relaxed to enhance the reliability of surface-emitting laser 100 during long-term use.

A base angle θ of the mesa is preferably greater than or equal to 70° and less than or equal to 80°. This allows to further relax the concentration of stress.

The optical path length of each of n-type contact layer 26 and etching stop layer 22 may be (integral multiple of λ/2)+(λ/4) when the oscillation wavelength of light-emitting layer 34 is λ. A mirror performance of lower DBR layer 12 can be maintained by setting the optical path length of n-type contact layer 26 and etching stop layer 22 as described above. When the optical path length is the integral multiple of λ/2, a parasitic cavity is formed and light is confined in n-type contact layer 26 or etching stop layer 22, which may impair the optical confinement performance of cavity layer 14. With the above optical path length, the optical confinement performance of cavity layer 14 can be maintained.

The number of pairs of n-type DBR layer 24 above etching stop layer 22 may be 4 or more, and the number of pairs of DBR layer 20 below etching stop layer 22 may be 20 or more. When a device is operated by attaching electrodes 50 on n-type contact layer 26, a current also flows downward from n-type contact layer 26. Etching for isolation is preferably performed to a depth deeper than a depth range in which such a downward current flows. Therefore, it is preferable that etching stop layer 22 is spaced apart from n-type contact layer 26 by 4 or more pairs. In addition, in order to maintain a reflection mirror performance of entire lower DBR layer 12, it is preferable to form the DBR having 20 or more pairs below etching stop layer 22.

Further, the number of pairs of n-type DBR layer 24 above etching stop layer 22 may be 1 or more and 8 or fewer, and a p-type doped or undoped DBR layer below the etching stop layer 22 may be provided. Isolation can be ensured by forming a p-type or undoped layer below etching stop layer 22. When the device is operated by attaching electrodes 50 on n-type contact layer 26, since a current also flows downward from n-type contact layer 26, it is preferable that a portion of the DBR layer which is located below and adjacent to n-type contact layer 26 and also above etching stop layer 22 is made n-type doped, which reduces a resistance in a lateral direction. However, when the n-type doped portion is too thick, etching stop layer 22 is located at a deeper position, which is not preferable. Therefore, the number of pairs of n-type DBR layer 24 which is an n-type doped DBR is preferably 1 or more pairs and 8 or fewer pairs.

Supplementary Note 1

A surface-emitting laser includes a lower DBR layer, a cavity layer, and an upper DBR layer that are stacked in this order on top of a substrate, wherein the lower DBR layer has a first DBR layer, a contact layer, and a second DBR layer that are stacked in this order on top of a substrate, wherein each of the first DBR layer and the second DBR layer includes a plurality of first layers and a plurality of second layers that are alternately stacked, wherein each of the first layers and the second layers is a semiconductor layer including aluminum, wherein a composition ratio of the aluminum of each first layer is lower than that of the aluminum of each second layer, wherein the first DBR layer further includes an etching stop layer, and wherein an optical path length of each of the contact layer and the etching stop layer is (integral multiple of λ/2+λ/4) when an oscillation wavelength is λ.

Supplementary Note 2

The surface-emitting laser according to Supplementary Note 1, wherein the first DBR layer includes four pairs of the first layer and the second layer above the etching stop layer, and includes 20 or more pairs of the first layer and the second layer below the etching stop layer.

Supplementary Note 3

The surface-emitting laser according to Supplementary Note 1, wherein the first DBR layer includes a n-type doped DBR including 1 or more and 8 or fewer pairs of the first layer and the second layer above the etching stop layer, and includes a p-type doped DBR or an undoped DBR below the etching stop layer.

Embodiments according to the present disclosure have been described above. However, the present disclosure is not limited to the embodiment described above, and various modifications and changes can be made to the present disclosure within the scope of the gist of the present disclosure described in the Claims.

REFERENCE SIGNS LIST 10 substrate
11 mesa
12 lower DBR layer
14 cavity layer
16 upper DBR layer
18 p-type contact layer
19 cap layer
20 DBR layer
22 etching stop layer
24, 28 n-type DBR layer
26 n-type contact layer
30, 32, 36, 38, 40 spacer layer
34 light-emitting layer
41 oxide confinement layer
42 p-type DBR layer
50, 52 electrode
54 groove
100, 100R surface-emitting laser

The invention claimed is:

1. A surface-emitting laser comprising:
a lower DBR layer, a cavity layer, and an upper DBR layer that are stacked in this order on top of a substrate,
wherein the lower DBR layer has a first DBR layer, a contact layer, and a second DBR layer that are stacked in this order on top of the substrate,
wherein each of the first DBR layer and the second DBR layer includes a plurality of first layers and a plurality of second layers that are alternately stacked,
wherein each of the first layers and the second layers is a semiconductor layer including aluminum,
wherein composition of the aluminum in each first layer is lower than composition of the aluminum in each second layer,
wherein the second DBR layer includes 12 or more and 20 or fewer pairs of the first layers and the second layers,
wherein the cavity layer includes a first spacer layer, a second spacer layer, a light-emitting layer, a third spacer layer, and a fourth spacer layer that are stacked in this order from the lower DBR layer,
wherein each of the first spacer layer and the fourth spacer layer is an aluminum gallium arsenide layer having a composition of aluminum that is greater than or equal to 0.75 and less than or equal to 0.95,
wherein each of the second spacer layer and the third spacer layer is an aluminum gallium arsenide layer having a composition of aluminum that is greater than or equal to 0.25 and less than or equal to 0.45,
wherein the light-emitting layer is a quantum well light-emitting layer,
wherein an optical confinement factor of the contact layer is less than or equal to 1%, and
wherein an optical confinement factor of the light-emitting layer is greater than or equal to 3.14% and less than or equal to 3.18%.

2. The surface-emitting laser according to claim 1, wherein an optical path length from the contact layer to the cavity layer is greater than or equal to 6 times and less than or equal to 10 times an oscillation wavelength of the cavity layer.

3. The surface-emitting laser according to claim 1, wherein the lower DBR layer includes 30 or more pairs of the first layers and the second layers.

4. The surface-emitting laser according to claim 3, wherein the contact layer includes aluminum gallium arsenide and composition of the aluminum in the contact layer is less than or equal to 0.2.

5. The surface-emitting laser according to claim 1, wherein an optical path length of the cavity layer is less than or equal to half of an oscillation wavelength of the cavity layer.

6. The surface-emitting laser according to claim 1, wherein a ratio of an optical confinement factor to a thickness of the contact layer is less than or equal to 2%/µm, and
wherein a ratio of an optical confinement factor of the light-emitting layer to a total thickness of well layers included in the light-emitting layer is greater than or equal to 143%/µm and less than or equal to 145%/µm.

7. The surface-emitting laser according to claim 1, wherein the second DBR layer includes n-type aluminum gallium arsenide,
wherein the upper DBR layer includes p-type aluminum gallium arsenide and an oxide confinement layer.

8. The surface-emitting laser according to claim 1, wherein:
the second DBR layer, the cavity layer, and the upper DBR layer form a mesa, and
an angle between a side wall of the mesa and a bottom surface of the mesa is greater than or equal to 70° and less than or equal to 80°.

9. A surface-emitting laser comprising:
a lower DBR layer, a cavity layer, and an upper DBR layer that are stacked in this order on top of a substrate,
wherein the lower DBR layer has a first DBR layer, a contact layer, and a second DBR layer that are stacked in this order on top of the substrate,
wherein each of the first DBR layer and the second DBR layer includes a plurality of first layers and a plurality of second layers that are alternately stacked,
wherein each of the first layers and the second layers is a semiconductor layer including aluminum,
wherein composition of the aluminum in each first layer is lower than composition of the aluminum in each second layer, wherein the second DBR layer includes 12 or more and 20 or fewer pairs of the first layers and the second layers, wherein the cavity layer includes a first spacer layer, a second spacer layer, a light-emitting layer, a third spacer layer, and a fourth spacer layer that are stacked in this order from the lower DBR layer, wherein each of the first spacer layer and the fourth spacer layer is an aluminum gallium arsenide layer having a composition of aluminum that is greater than or equal to 0.75 and less than or equal to 0.95, wherein each of the second spacer layer and the third spacer layer is an aluminum gallium arsenide layer having a composition of aluminum that is greater than or equal to 0.25 and less than or equal to 0.45, wherein the light-emitting layer is a quantum well light-emitting layer, wherein a ratio of an optical confinement factor to a thickness of the contact layer is less than or equal to 2%/μm, and wherein a ratio of an optical confinement factor of the light-emitting layer to a total thickness of well layers included in the light-emitting layer is greater than or equal to 143%/μm and less than or equal to 145%/μm.

\*    \*    \*    \*    \*